(12) United States Patent
Lee et al.

(10) Patent No.: US 10,026,926 B2
(45) Date of Patent: Jul. 17, 2018

(54) FLEXIBLE ORGANIC LIGHT EMITTING DIODE DISPLAY DEVICE AND METHOD OF FABRICATING THE SAME

(71) Applicant: LG Display Co., Ltd., Seoul (KR)

(72) Inventors: Jae-Young Lee, Paju-si (KR); Ji-Min Kim, Seoul (KR); Gi-Youn Kim, Goyang-si (KR); Sang-Hoon Oh, Jeollabuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/935,277

(22) Filed: Nov. 6, 2015

(65) Prior Publication Data

US 2017/0005292 A1    Jan. 5, 2017

(30) Foreign Application Priority Data

Jun. 30, 2015    (KR) .................. 10-2015-0092836

(51) Int. Cl.

| | |
|---|---|
| H01L 21/00 | (2006.01) |
| H01L 51/00 | (2006.01) |
| H01L 29/08 | (2006.01) |
| H01L 35/24 | (2006.01) |
| H01L 51/52 | (2006.01) |
| H01L 27/32 | (2006.01) |

(52) U.S. Cl.
CPC ...... H01L 51/5256 (2013.01); *H01L 27/3244* (2013.01); *H01L 2251/5338* (2013.01)

(58) Field of Classification Search
CPC ............ H01L 51/5256; H01L 51/5253; H01L 2251/301; H01L 51/5237; H01L 23/564; H01L 23/26; H01L 27/3246; H01L 51/56

USPC .... 257/40, 100, 678, 682; 438/26, 758, 127, 438/471, 143
See application file for complete search history.

(56) References Cited

U.S. PATENT DOCUMENTS

| | | | | |
|---|---|---|---|---|
| 9,023,693 | B1* | 5/2015 | Lin ................... | C23C 16/45536 257/E21.008 |
| 2007/0267973 | A1* | 11/2007 | Suh ..................... | H01L 51/5256 313/512 |
| 2010/0261008 | A1* | 10/2010 | Kikuchi .................. | C08J 7/045 428/332 |
| 2014/0070195 | A1* | 3/2014 | Choi .................. | H01L 51/5256 257/40 |

(Continued)

FOREIGN PATENT DOCUMENTS

CN    104638200 A    *    5/2015

*Primary Examiner* — Lex Malsawma
*Assistant Examiner* — Nduka Ojeh
(74) *Attorney, Agent, or Firm* — Fenwick & West LLP

(57) ABSTRACT

Embodiments relate to a method of forming an organic light emitting diode (OLED) display device. A first inorganic layer, a first organic layer, and a second inorganic layer are formed on pixel regions of an OLED display device. At least part of a first inorganic layer is formed using atomic layer deposition (ALD), such that the first inorganic layer completely covers particles generated on the OLED. Embodiments also relate to an OLED display device with pixel regions, each pixel region including an OLED, a bank layer across a boundary between adjacent pixel regions, and a first inorganic layer on at least a portion of the OLED and the bank layer. The first inorganic layer includes a first inorganic sub-layer and a second inorganic sub-layer.

9 Claims, 7 Drawing Sheets

(56) References Cited

U.S. PATENT DOCUMENTS

| | | | |
|---|---|---|---|
| 2014/0132487 A1* | 5/2014 | Park | G02F 1/13454 345/55 |
| 2015/0108435 A1* | 4/2015 | Huh | H01L 51/5256 257/40 |
| 2016/0233453 A1* | 8/2016 | Lee | H01L 51/5256 |
| 2017/0222176 A1* | 8/2017 | Hayk | H01L 51/5212 |

\* cited by examiner

FLEXIBLE ORGANIC LIGHT EMITTING DIODE DISPLAY DEVICE AND METHOD OF FABRICATING THE SAME

CROSS-REFERENCE TO RELATED APPLICATION

The present application claims the benefit of Republic of Korea Patent Application No. 10-2015-0092836 filed in Korea on Jun. 30, 2015, which is hereby incorporated by reference herein in its entirety.

BACKGROUND OF THE INVENTION

Field of the Invention

The present invention relates to an organic light emitting diode (OLED) display device and more particularly to an OLED display device being of preventing damage on a light emitting diode and a method of fabricating the same.

Discussion of the Related Art

Various display devices for displaying images are currently being used. Flat panel display devices, such as a liquid crystal display (LCD) device, a plasma display panel (PDP) and an organic light emitting diode (OLED) display device, are widely researched and used instead of a cathode ray tube (CRT) display device because of their excellent capabilities of a thin profile and light weight.

Since the OLED display device has advantages in a response time, a contrast ratio, a viewing angle and power consumption, the OLED display device is widely researched among flat panel display devices.

A light emitting diode including an organic emitting layer is very weak to moisture. To prevent the moisture to the light emitting diode and protect the light emitting diode, an encapsulation substrate of glass is attached on the light emitting diode.

Recently, flexible display devices, e.g., a foldable display device, a bendable display device or a rollable display device, are introduced. In the flexible display device, new encapsulation film, an inorganic layer and an organic layer is used instead of the glass encapsulation substrate.

FIG. 1 is a schematic cross-sectional view of the related art OLED display device.

As shown in FIG. 1, the OLED display device 1 includes a flexible substrate 10, where a display area AA and a non-display area NA at peripheries of the display area AA are defined, a light emitting diode D on the flexible substrate 10, and an encapsulation film 20 covering the light emitting diode D.

The flexible substrate 10 may be formed of polymer such as polyimide, and the light emitting diode D is formed on the flexible substrate 10.

The light emitting diode D is disposed in the display area AA, and a driving unit (not shown) for driving the light emitting diode D may be formed in the non-display area NA.

Although not shown, the light emitting diode D includes a first electrode, a second electrode facing the first electrode, and an organic emitting layer therebetween. In addition, a switching thin film transistor (TFT) as a switching element and a driving TFT as a driving element are formed in each pixel region and on the flexible substrate 10. For example, the first electrode of the light emitting diode D may be connected to the driving TFT.

The encapsulation film 20 covers the light emitting diode D and corresponds to the display area AA and the non-display area NA. The damages on the light emitting diode D in a condition of high temperature and high humidity are prevented by the encapsulation film 20.

In the encapsulation film 20, an inorganic layer and an organic layer are alternately stacked. For example, the encapsulation film 20 may include a first inorganic layer 22 on the light emitting diode D, an organic layer 24 on the first inorganic layer 22 and a second inorganic layer 26 on the organic layer 24. Namely, the encapsulation film 20 may have a triple-layered structure.

In addition, a barrier film 30 may be attached to the encapsulation film 20 using an adhesion layer 32.

However, when the OLED display device 1 is operated or stored in a condition of high temperature and high humidity, the damages on the light emitting diode D is still generated. In addition, when the OLED display device is folded, bent or rolled, there are other damages in the light emitting diode D. Accordingly, there are problems in a displaying quality and or lifetime of the related art OLED display device 1.

SUMMARY OF THE INVENTION

Embodiments relate to a method of forming an organic light emitting diode (OLED) display device. A plurality of pixel regions is formed on a display area of a flexible substrate, where each pixel region includes an OLED. At least part of a first inorganic layer is formed on the plurality of pixel regions using atomic layer deposition (ALD) or plasma-enhanced chemical vapor deposition (PECVD). A first organic layer is formed and a second inorganic layer is formed using PECVD.

In one embodiment, the entire first inorganic layer is formed using ALD.

In one embodiment, a first inorganic sub-layer of the first inorganic layer is formed using ALD and a second inorganic sub-layer of the first inorganic layer is formed using PECVD.

In one embodiment, the second inorganic sub-layer is formed on the first inorganic sub-layer.

In one embodiment, the first inorganic sub-layer is formed on the second inorganic sub-layer.

In one embodiment, a second organic layer is formed on the second inorganic layer.

In one embodiment, a thickness of the first organic layer is larger than a thickness of the second organic layer, and the first organic layer is formed of acryl-based compounds and the second organic layer is formed of epoxy-based compounds.

In one embodiment, a modulus value of the second organic layer is smaller than a modulus value of the first organic layer.

In one embodiment, a thickness of the first inorganic sub-layer is 0.01 to 0.1 micrometers.

In one embodiment, a thickness of the second inorganic sub-layer and the second inorganic layer is 0.1 to 2 micrometers.

Embodiments also relate to an organic light emitting diode (OLED) display device. The display device includes a flexible substrate having a display area and a non-display area, and a plurality of pixel regions on the display area of the flexible substrate. Each pixel region includes a driving transistor, and an organic light emitting diode including a first electrode, an organic emitting layer, and a second electrode. The first electrode is connected to an electrode of the driving transistor. A bank layer is placed in and extending across a boundary between the pixel region and a pixel region adjacent to the pixel region. A spacer is placed on a portion of the bank layer, in which a portion of the spacer of a first distance to the bank layer has a width smaller than a width of another portion of the spacer of a second distance larger than the first distance to the bank layer. A first inorganic layer covers at least a portion of a side surface of the spacer.

In one embodiment, the display device further includes a first organic layer on the first inorganic layer, and a second inorganic layer on the first organic layer. A thickness of the second inorganic layer is larger than a thickness of the first inorganic layer.

In one embodiment, the thickness of the first inorganic layer is 0.01 to 0.1 micrometers.

In one embodiment, the thickness of the second inorganic layer is 0.1 to 2 micrometers.

In one embodiment, the spacer is of a reversed-tapered shape.

In one embodiment, the first inorganic layer is deposited by atomic layer deposition (ALD).

In one embodiment, a second electrode material pattern is on a top surface of the spacer, wherein the second electrode material pattern is physically isolated from the second electrode.

Embodiments also relate to an organic light emitting diode (OLED) display device. The display device includes a flexible substrate having a display area and a non-display area, and a plurality of pixel regions on the display area of the flexible substrate. Each pixel region includes a driving transistor, and an organic light emitting diode including a first electrode, an organic emitting layer, and a second electrode. The first electrode is connected to an electrode of the driving transistor. A bank layer is placed in and extending across a boundary between the pixel region and a pixel region adjacent to the pixel region. The display device also includes a first inorganic layer on at least a portion of the organic light emitting diode and on at least a portion of the bank layer, the first inorganic layer having a first inorganic sub-layer and a second inorganic sub-layer.

In one embodiment, at least one of the first inorganic sub-layer or the second inorganic sub-layer has a thickness of 0.01 to 0.1 micrometers.

In one embodiment, the display device further includes a spacer on a portion of the bank layer, in which a portion of the spacer of a first distance to the bank layer has a width smaller than a width of another portion of the spacer of a second distance larger than the first distance to the bank layer.

In one embodiment, the display device further includes a first organic layer on the first inorganic layer, a second inorganic layer on the first organic layer, and a second organic layer on the second inorganic layer. A modulus value of the second organic layer is smaller than a modulus value of the first organic layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

In the OLED display device, particles may be generated on the light emitting diode, and cracks may be generated in the encapsulation film by the particles. As a result, the moisture may penetrate into the light emitting diode through the cracks in the encapsulation film.

Generally, the inorganic layer contacting the light emitting diode is formed by a plasma enhanced chemical vapor deposition (PECVD) method such that the inorganic layer has bad step-coverage. The particles on the light emitting diode are incompletely covered with the inorganic layer of the encapsulation film such that the cracks may be generated in the encapsulation film. As a result, damages on the light emitting diode by moisture may be generated.

On the other hand, the particles may be completely covered with the inorganic layer by increasing the thickness of the inorganic layer. However, a side portion under the particles may be incompletely covered such that the damage on the light emitting diode by moisture may be still generated.

In addition, when the thickness of the inorganic layer is increased, the stress on the encapsulation film during folding, bending or rolling operation is increased such that the cracks are generated in the encapsulation film and the flexibility of the device is decreased.

Accordingly, the present invention provides an OLED display device being capable of preventing the above problems.

Figure 1:
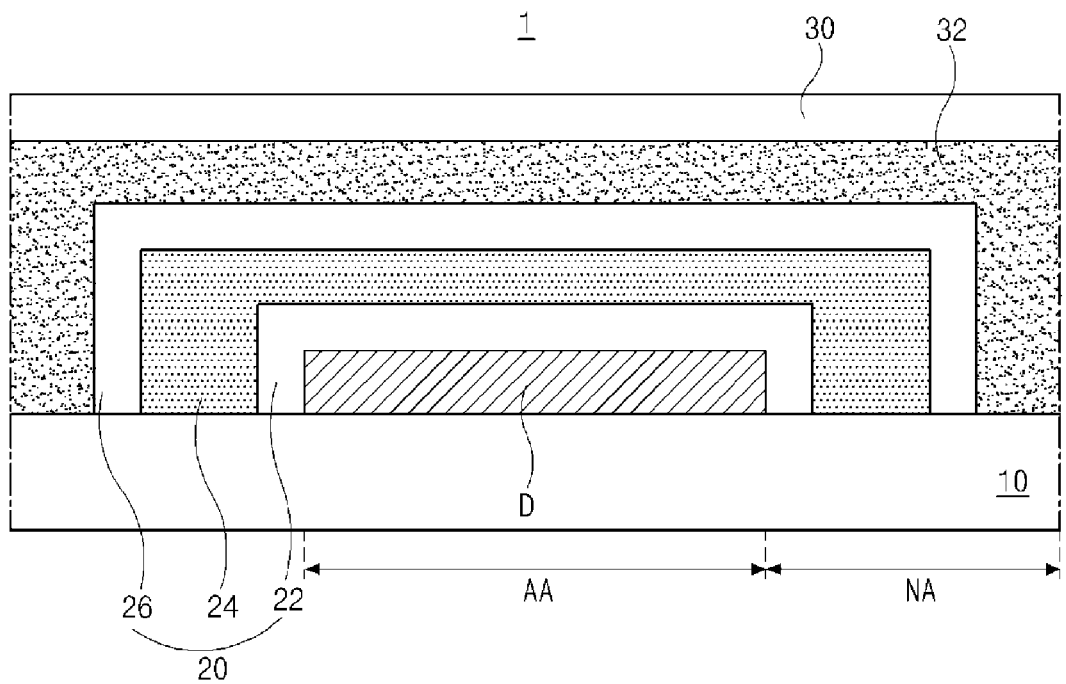
FIG. 1 is a schematic cross-sectional view of an OLED display device of a related art.
Figure 2:
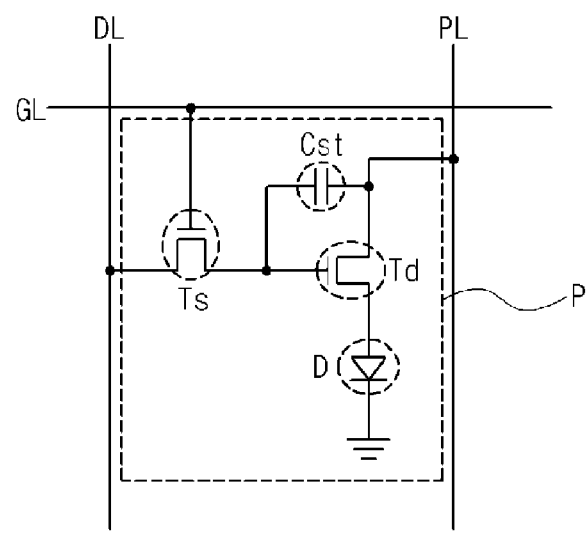
FIG. 2 is a schematic circuit diagram of a pixel in a flexible OLED display device, according to an embodiment of the present invention.

FIG. 2 is a schematic view illustrating a flexible OLED display device of the present invention. Referring to FIG. 2, in an OLED display device includes a gate line "GL", a data line "DL", a power supply line "PL", a switching thin film transistor (TFT) "Ts", a storage capacitor "Cst", a driving TFT "Td", and a light emitting diode "D". The gate line "GL" and the data line "DL" cross each other to define a pixel region "P".

The switching TFT "Ts" is connected to the gate and data line "GL" and "DL", and the driving TFT "Td" and the storage capacitor "Cst" are connected to the switching TFT "Ts" and the power line "PL". The light emitting diode "D" is connected to the driving TFT "Td".

When the switching TFT "Ts" is turned on by a gate signal applied through the gate line "GL", a data signal from the data line "DL" is applied to the gate electrode of the driving TFT "Td" and an electrode of the storage capacitor "Cst". When the driving TFT "Td" is turned on by the data signal, an electric current is supplied to the light emitting diode "D" from the power line "PL". As a result, the light emitting diode "D" emits light. In this case, when the driving TFT "Td" is turned on, a level of an electric current applied from the power supply line "PL" to the light emitting diode "D" is determined such that the light emitting diode "D" can produce a gray scale. The storage capacitor "Cst" serves to maintain the voltage of the gate electrode of the driving TFT "Td" when the switching TFT "Ts" is turned off. Accordingly, even if the switching TFT "Ts" is turned off, a level of an electric current applied from the power supply line "PL" to the light emitting diode "D" is maintained to next frame.

Figure 3:
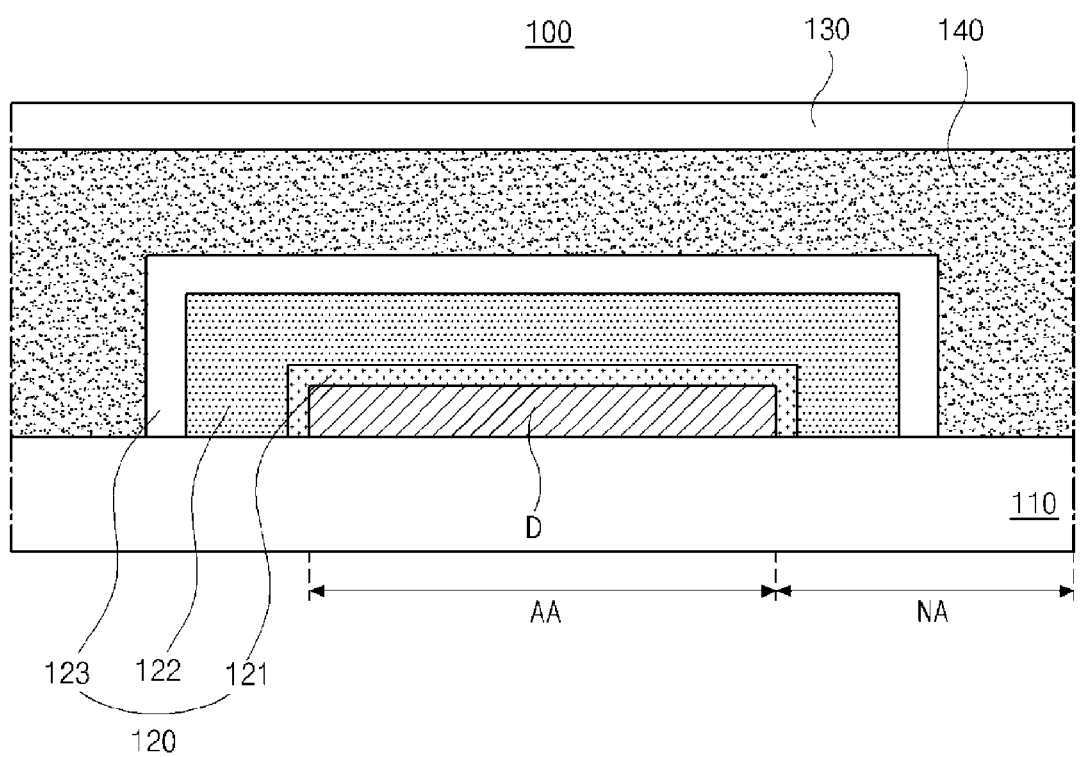
FIG. 3 is a schematic cross-sectional view of a flexible OLED display device, according to a first embodiment of the present invention.
Figure 4:
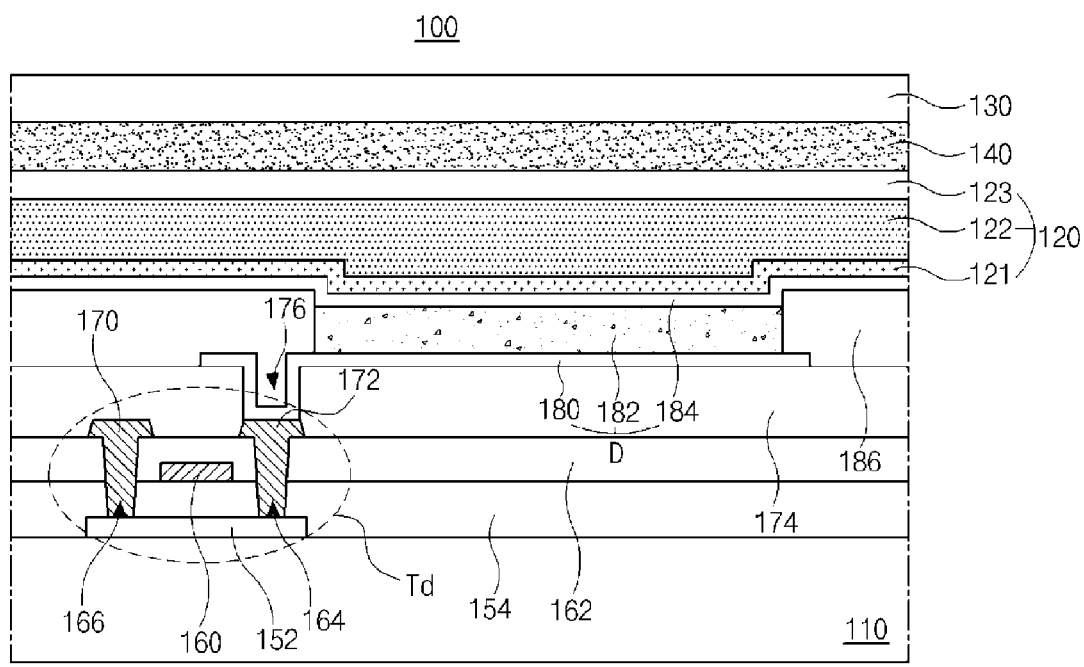
FIG. 4 is a schematic cross-sectional view illustrating one pixel region including a light emitting diode, according to one embodiment of the present invention.

FIG. 3 is a schematic cross-sectional view of a flexible OLED display device according to a first embodiment of the present invention, and FIG. 4 is a schematic cross-sectional view illustrating one pixel region including a light emitting diode.

As shown in FIGS. 3 and 4, a flexible OLED display device 100 according to the first embodiment of the present invention includes a flexible substrate 110, where a display area AA and a non-display area NA at peripheries of the display area AA are defined, a light emitting diode D on the flexible substrate 110, and an encapsulation film 120 covering the light emitting diode D, and a first inorganic layer 121 as a lowest layer of the encapsulation film 120 is formed by an atomic layer deposition (ALD) method.

The flexible substrate 110 may be formed of polymer such as polyimide. However, it is not limited thereto.

Although not shown, a buffer layer, which is formed of an inorganic insulating material, such as silicon oxide or silicon nitride, may be formed on the flexible substrate 110.

On the flexible substrate 110, a driving TFT Td and a light emitting diode D are formed. In addition, a gate line (not shown) and a data line (not shown), which cross each other to define a pixel region, a power line (not shown), which is parallel to and spaced apart from the gate line or the data line, a switching TFT (not shown), which is connected to the gate and data lines, a storage capacitor (not shown), which is connected to the power line and an electrode of the switching TFT, are further formed on the flexible substrate 110.

The driving TFT Td is connected to the switching TFT and includes a semiconductor layer 152, a gate electrode 160, a source electrode 170 and a drain electrode 172.

The semiconductor layer 152 is disposed on the flexile substrate 110 and may include an oxide semiconductor material or polycrystalline silicon.

When the semiconductor layer 152 includes the oxide semiconductor material, a light-shielding pattern (not shown) may be formed under the semiconductor layer 152. The light to the semiconductor layer 152 is shielded or blocked by the light-shielding pattern such that thermal degradation of the semiconductor layer 152 can be prevented. On the other hand, when the semiconductor layer 152 includes polycrystalline silicon, impurities may be doped into both sides of the semiconductor layer 152.

A gate insulating layer 154 is formed on an entire surface of the flexible substrate 110 including the semiconductor layer 152. The gate insulating layer 154 may be formed of an inorganic insulating material such as silicon oxide or silicon nitride. For example, when the semiconductor layer 152 includes the oxide semiconductor material, the gate insulating layer 154 may be formed of silicon oxide.

A gate electrode 160, which is formed of a conductive material, e.g., metal, is formed on the gate insulating layer 154 to correspond to a center of the semiconductor layer 152. The gate electrode 160 is connected to the switching TFT.

In FIG. 4, the gate insulating layer 154 is formed on the entire surface of the flexible substrate 110. Alternatively, the gate insulating layer 154 may be patterned to have the same shape as the gate electrode 160.

An interlayer insulating layer 162, which is formed of an insulating material, is formed on an entire surface of the flexible substrate 110 including the gate electrode 160. The interlayer insulating layer 162 may be formed of an inorganic insulating material, e.g., silicon oxide or silicon nitride, or an organic insulating material, e.g., benzocyclobutene or photo-acryl.

The interlayer insulating layer 162 includes first and second contact holes 164 and 166 exposing both sides of the semiconductor layer 152. The first and second contact holes 164 and 166 are positioned at both sides of the gate electrode 160 to be spaced apart from the gate electrode 160.

In FIG. 4, the first and second contact holes 164 and 166 extend into the gate insulating layer 154. Alternatively, when the gate insulating layer 154 is patterned to have the same shape as the gate electrode 160, there may be no first and second contact holes 164 and 166 in the gate insulating layer 154.

A source electrode 170 and a drain electrode 172, which are formed of a conductive material, e.g., metal, are formed on the interlayer insulating layer 162. The drain electrode 172 and the source electrode 170 are spaced apart from each other with respect to the gate electrode 160 and respectively contact both sides of the semiconductor layer 152 through the first and second contact holes 164 and 166. The source electrode 170 is connected to the power line (not shown).

The semiconductor layer 152, the gate electrode 160, the source electrode 170 and the drain electrode 172 constitute the driving TFT Td. In FIG. 4, the gate electrode 160, the source electrode 170 and the drain electrode 172 are positioned over the semiconductor layer 152. Namely, the driving TFT Td has a coplanar structure.

Alternatively, in the driving TFT Td, the gate electrode may be positioned under the semiconductor layer, and the source and drain electrodes may be positioned over the semiconductor layer such that the driving TFT Td may have an inverted staggered structure. In this instance, the semiconductor layer may include amorphous silicon.

The switching TFT (not shown) may have substantially the same structure as the driving TFT Td.

A passivation layer 174, which includes a drain contact hole 176 exposing the drain electrode 172 of the driving TFT Td, is formed to cover the driving TFT Td.

A first electrode 180, which is connected to the drain electrode 172 of the driving TFT Td through the drain contact hole 176, is separately formed on the passivation layer 174 in each pixel region. The first electrode 180 may be an anode and may be formed of a conductive material having a relatively high work function. For example, the first electrode 180 may be formed of a transparent conductive material such as indium-tin-oxide (ITO) or indium-zinc-oxide (IZO).

When the flexible OLED display device 100 is operated in a top-emission type, a reflection electrode or a reflection layer may be formed under the first electrode 180. For example, the reflection electrode or the reflection layer may be formed of aluminum-paladium-copper (APC) alloy.

A bank layer 186, which covers edges of the first electrode 180, is formed on the passivation layer 174. A center of the first electrode 180 in the pixel region is exposed through an opening of the bank layer 186.

An organic emitting layer 182 is formed on the first electrode 180. The organic emitting layer 182 may have a single-layered structure of an emitting material layer formed of an emitting material. Alternatively, to improve emitting efficiency, the organic emitting layer 182 may have a multi-layered structure including a hole injection layer, a hole transporting layer, the emitting material layer, an electron transporting layer and an electron injection layer sequentially stacked on the first electrode 180.

A second electrode 184 is formed over the flexible substrate 110 including the organic emitting layer 182. The second electrode 184 is positioned at an entire surface of the display area AA. The second electrode 184 may be a cathode and may be formed of a conductive material having a relatively low work function. For example, the second electrode 184 may be formed of aluminum (Al), magnesium (Mg) or Al—Mg alloy.

The first electrode 180, the organic emitting layer 182 and the second electrode 184 constitute the light emitting diode D.

An encapsulation film 120 is formed on the second electrode 184 to prevent penetration of moisture into the light emitting diode D.

The encapsulation film 120 has a triple-layered structure of a first inorganic layer 121, an organic layer 122 and a second inorganic layer 123. However, it is not limited thereto. For example, the encapsulation film 120 may further include an organic layer on the second inorganic layer 123 to have a quadruple-layered structure or may further include an organic layer and an inorganic layer on the second inorganic layer 123 to have a five-layered structure.

The first inorganic layer 121 contacts the light emitting diode D and is formed by the ALD process to have excellent step-coverage. For example, the first inorganic layer 121 may be formed of silicon oxide (SiOx), silicon nitride (SiNx) or siliconoxynitride (SiON). The first inorganic layer 121 may have a thickness of about 0.01 to 0.1 micrometers, and beneficially, about 0.05 micrometers.

The organic layer 122 is formed on the first inorganic layer 121. The organic layer 122 may be formed using various methods of depositing an organic layer, including but not limited to: vacuum screen printing, inkjet printing, flash evaporation, electro spray coating, and chemical vapor deposition (CVD). The stress applied to the first inorganic layer 121 can be reduced by the organic layer 122. For example, the organic layer 122 may be formed of an acryl-based material or an epoxy-based material.

The second inorganic layer 123 is formed on the organic layer 122. The second inorganic layer 123 is formed by the PECVD process and has a thickness larger than the first inorganic layer 121. The penetration of moisture into the light emitting diode D is further prevented by the second inorganic layer 123.

For example, the second inorganic layer 123 may be formed of silicon oxide (SiOx), silicon nitride (SiNx) or siliconoxynitride (SiON). The second inorganic layer 123 may have a thickness of about 0.1 to 2 micrometers, and beneficially, about 1 micrometer. To minimize the moisture penetration into the light emitting diode D, it is preferred that the second inorganic layer 123 may be formed of silicon nitride or siliconoxynitride.

A barrier film 130 further minimizing the moisture penetration and protecting the encapsulation film 120 may be attached onto the encapsulation film 120 using an adhesion layer 140. For example, the adhesion layer 140 may be a pressure sensitive adhesive. The barrier film 130 and the adhesion layer 140 may be omitted.

Alternatively, a touch panel (not shown) may be attached on the encapsulation film 120 using the adhesion layer 140, and/or a polarization plate (not shown) may be further attached on an outer side of the encapsulation film 120 to reduce ambient light reflection and increase a contrast ratio. In this instance, the polarization plate may be a circular polarization plate.

As mentioned above, in the flexible OLED display device 100 according to the first embodiment of the present invention, the first inorganic layer 121 as a lowest layer of the encapsulation film 120 is formed by the ALD process to have excellent step-coverage.

Accordingly, even if there are particles on the light emitting diode D, the particles are completely covered with the first inorganic layer 121 such that there is no crack in the encapsulation film 120. As a result, the damages on an element in the display area AA, e.g., the light emitting diode D, by moisture penetration are minimized or prevented.

In addition, since the first inorganic layer 121, which is formed by the ALD process, has a relatively small thickness with excellent step-coverage, a thickness of the encapsulation film 120 is not increased.

Namely, the flexible OLED display device 100 of the present invention has improved displaying quality and lifetime without increasing the thickness.

However, since the thickness of the first inorganic layer 121 formed by the ALD process is relatively small, there is a limitation to prevent the moisture penetration.

Figure 5:
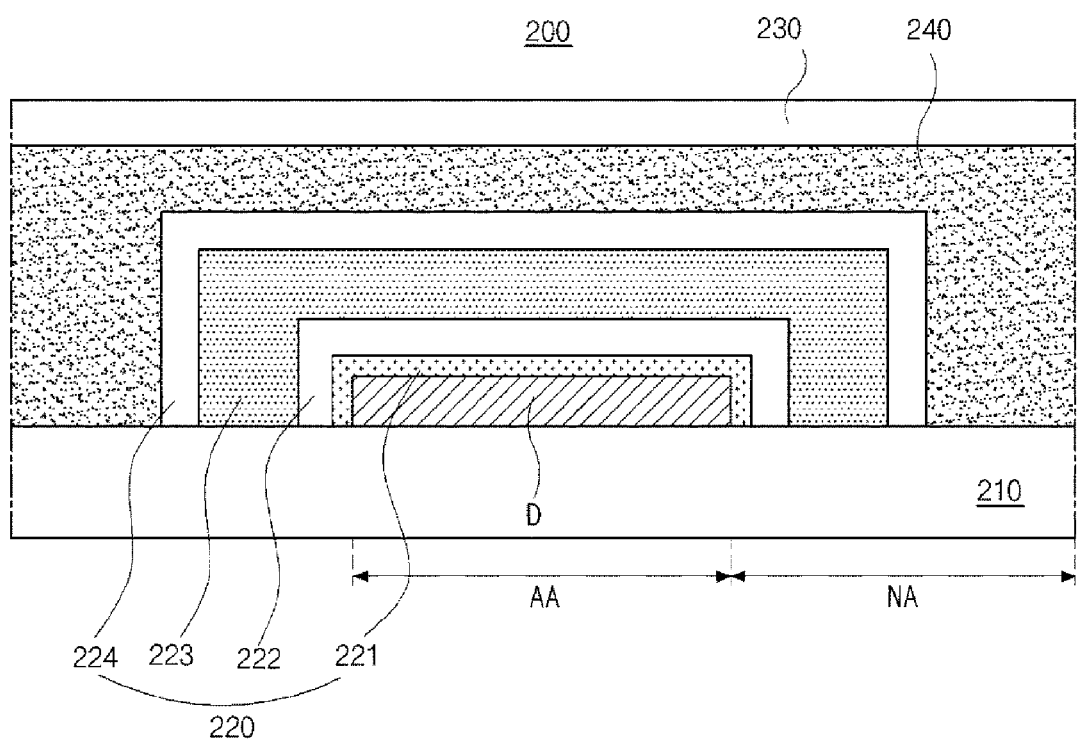
FIG. 5 is a schematic cross-sectional view of a flexible OLED display device according to a second embodiment of the present invention.

FIG. 5 is a schematic cross-sectional view of a flexible OLED display device according to a second embodiment of the present invention.

As shown in FIG. 5, a flexible OLED display device 200 according to the second embodiment of the present invention includes a flexible substrate 210, where a display area AA and a non-display area NA at peripheries of the display area AA are defined, a light emitting diode D on the flexible substrate 210 and an encapsulation film 220 covering the light emitting diode D and including a first inorganic sub-layer 221, a second inorganic sub-layer 222, an organic layer 223 and a second inorganic layer 224. The first inorganic layer includes the first inorganic sub-layer 221 and the second inorganic sub-layer 222. The first inorganic sub-layer 221 as a lowest layer of the encapsulation film 220 is formed by the ALD method, and the second inorganic sub-layer 222 on the first inorganic sub-layer 221 is formed by the PECVD method.

The flexible substrate 210 may be formed of polymer such as polyimide. However, it is not limited thereto.

On the flexible substrate 210, a driving TFT Td (of FIG. 4) and a light emitting diode D connected to the driving TFT Td are formed.

As illustrated with FIG. 4, the driving TFT Td includes the semiconductor layer 152, the gate electrode 160, the source electrode 170 and the drain electrode 172, and the light emitting diode D includes the first electrode 180, which is connected to the drain electrode 172, the second electrode 184, which faces the first electrode 180, and the organic emitting layer 182 therebetween.

The encapsulation film 220 is formed on the light emitting diode D to prevent the moisture penetration into the light emitting diode D.

The encapsulation film 220 has a quadruple-layered structure of the first inorganic sub-layer 221, the second inorganic sub-layer 222, the organic layer 223 and the second inorganic layer 224. However, it is not limited thereto. For example, the encapsulation film 220 may further include an organic layer on the second inorganic layer 224 to have a five-layered structure or may further include an organic layer and an inorganic layer on the second inorganic layer 224 to have a six-layered structure.

The first inorganic sub-layer 221 contacts the light emitting diode D and is formed by the ALD process to have excellent step-coverage. For example, the first inorganic sub-layer 221 may be formed of silicon oxide (SiOx), silicon nitride (SiNx) or siliconoxynitride (SiON). The first inorganic sub-layer 221 may have a thickness of about 0.01 to 0.1 micrometers, and beneficially, about 0.05 micrometers.

The second inorganic sub-layer 222 is formed on the first inorganic sub-layer 221 and covers the first inorganic sub-layer 221. The second inorganic sub-layer 222 is formed by the PECVD process and has a thickness larger than the first inorganic sub-layer 221. The penetration of moisture into the light emitting diode D is further prevented by the second inorganic layer 222.

Since the first inorganic sub-layer 221 is formed by the ALD process and the second inorganic sub-layer 222 is formed by the PECVD process, a thickness of the first inorganic sub-layer 221 is smaller than the second inorganic sub-layer 222 and a molecular density of the first inorganic sub-layer 221 is larger than the second inorganic sub-layer 222.

The first inorganic sub-layer 221, which is formed by the ALD process, completely covers the particles on the light emitting diode D such that the second inorganic sub-layer 222 can have a relatively small thickness.

For example, the second inorganic sub-layer 222 may be formed of silicon oxide (SiOx), silicon nitride (SiNx) or siliconoxynitride (SiON). The second inorganic sub-layer 222 may have a thickness of about 0.1 to 2 micrometers, and beneficially, about 1 micrometer. To minimize the moisture penetration into the light emitting diode D, it is preferred that the second inorganic sub-layer 222 may be formed of silicon nitride or siliconoxynitride.

Namely, when the inorganic layer as a lowest layer of the encapsulation film 220 has a single-layered structure formed by the PECVD process, the single-layered inorganic layer should have a sufficient thickness to cover the particles and prevent the moisture penetration. However, in the present invention, since the particles are completely covered with the first inorganic sub-layer 221, which is formed by the ALD process, the thickness of the second inorganic sub-layer 222 is reduced.

The organic layer 223 is formed on the second inorganic sub-layer 222. The organic layer 223 may be formed by any one of vacuum screen printing, inkjet printing, flash evaporation, electro spray coating, defect free chemical vapor deposition (CVD), or any other method of depositing an organic layer. The stress applied to the first inorganic sub-layer 221 and the second inorganic sub-layer 222 can be reduced by the organic layer 223. For example, the organic layer 223 may be formed of an acryl-based material or an epoxy-based material.

The second inorganic layer 224 is formed on the organic layer 223. The second inorganic layer 224 is formed by the PECVD process and has a thickness substantially same as the second inorganic sub-layer 222. The penetration of moisture into the light emitting diode D is further prevented by the second inorganic layer 224. The second inorganic layer 224 may be formed of the same material as the second inorganic sub-layer 222.

A barrier film 230 further minimizing the moisture penetration and protecting the encapsulation film 220 may be attached onto the encapsulation film 220 using an adhesion layer 240. For example, the adhesion layer 240 may be a pressure sensitive adhesive. The barrier film 230 and the adhesion layer 240 may be omitted.

Alternatively, a touch panel (not shown) may be attached on the encapsulation film 220 using the adhesion layer 240, and/or a polarization plate (not shown) may be further attached on an outer side of the encapsulation film 220 to reduce ambient light reflection and increase a contrast ratio. In this instance, the polarization plate may be a circular polarization plate.

As mentioned above, in the flexible OLED display device 200 according to the second embodiment of the present invention, the first inorganic sub-layer 221 as a lowest layer of the encapsulation film 220 is formed by the ALD process to have excellent step-coverage.

Accordingly, even if there are particles on the light emitting diode D, the particles are completely covered with the first inorganic sub-layer 221 such that there is no crack in the encapsulation film 220. As a result, the damages on an element in the display area AA, e.g., the light emitting diode D, by moisture penetration are minimized or prevented.

In addition, since the first inorganic sub-layer 221, which is formed by the ALD process, has a relatively small thickness with excellent step-coverage, a thickness of the encapsulation film 220 is not increased.

Moreover, since the second inorganic sub-layer 222 covering the first inorganic sub-layer 221 is formed between the first inorganic sub-layer 221 and the organic layer 223, the moisture penetration into the light emitting diode D is minimized.

Further, since the particles on the light emitting diode D is completely covered with the first inorganic sub-layer 221 having excellent step-coverage, the second inorganic sub-layer 222 can have a relatively small thickness.

Namely, the flexible OLED display device 200 of the present invention has improved displaying quality and lifetime with minimal thickness increase.

Figure 6:
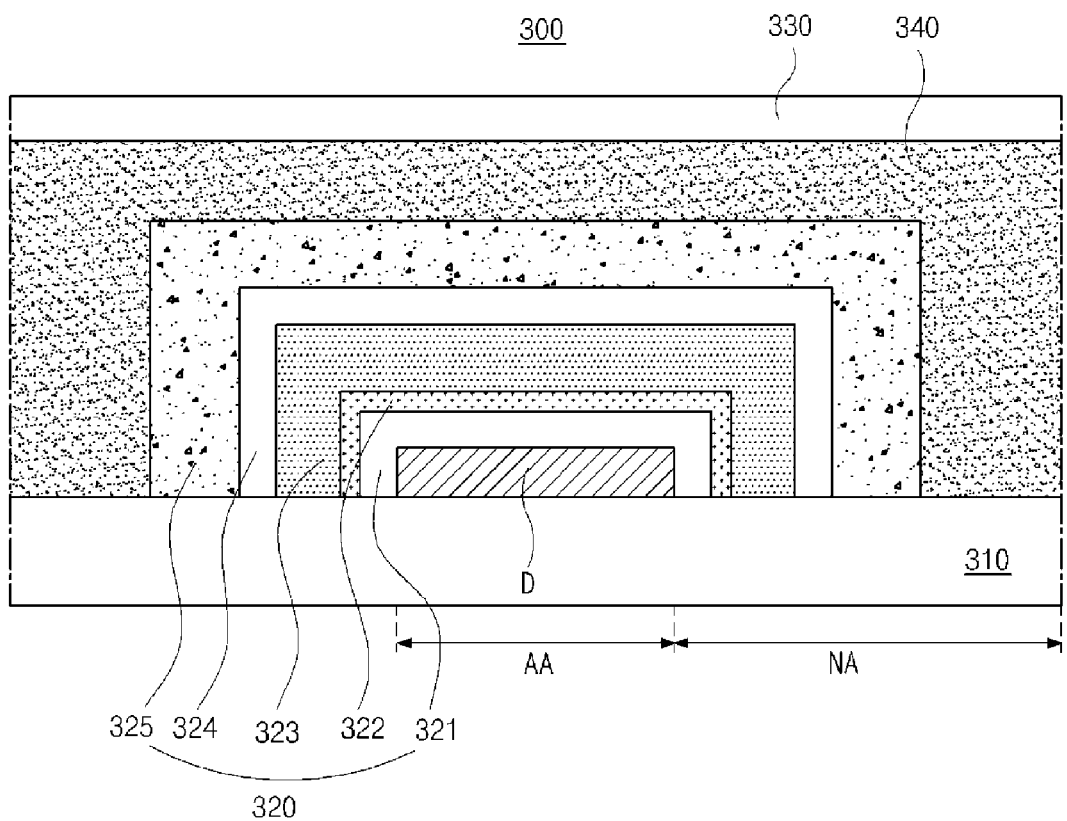
FIG. 6 is a schematic cross-sectional view of a flexible OLED display device according to a third embodiment of the present invention.

FIG. 6 is a schematic cross-sectional view of a flexible OLED display device according to a third embodiment of the present invention.

As shown in FIG. 6, a flexible OLED display device 300 according to the third embodiment of the present invention includes a flexible substrate 310, where a display area AA and a non-display area NA at peripheries of the display area AA are defined, a light emitting diode D on the flexible substrate 310 and an encapsulation film 320 covering the light emitting diode D and including a first inorganic sub-layer 321, a second inorganic sub-layer 322, a first organic layer 323, a second inorganic layer 324 and a second organic layer 325. The second inorganic layer includes the first inorganic sub-layer 321 and the second inorganic sub-layer 322. The first inorganic sub-layer 321 as a lowest layer of the encapsulation film 320 is formed by the PECVD method, and the second inorganic sub-layer 322 on the first inorganic sub-layer 321 is formed by the ALD method.

The flexible substrate 310 may be formed of polymer such as polyimide. However, it is not limited thereto.

On the flexible substrate 310, a driving TFT Td (of FIG. 4) and a light emitting diode D connected to the driving TFT Td are formed.

As illustrated with FIG. 4, the driving TFT Td includes the semiconductor layer 152, the gate electrode 160, the source electrode 170 and the drain electrode 172, and the light emitting diode D includes the first electrode 180, which is connected to the drain electrode 172, the second electrode 184, which faces the first electrode 180, and the organic emitting layer 182 therebetween.

The encapsulation film 320 is formed on the light emitting diode D to prevent the moisture penetration into the light emitting diode D.

In the encapsulation film 320, the first inorganic sub-layer 321, the second inorganic sub-layer 322, the first organic layer 323, the second inorganic layer 324 and the second organic layer 325 are sequentially stacked on the light emitting diode D. However, it is not limited thereto. For example, an organic layer and an inorganic layer may be further formed between the second inorganic layer 324 and the second organic layer 325.

The first inorganic sub-layer 321 contacts the light emitting diode D and covers the light emitting diode D.

The first inorganic sub-layer 321 is formed by the PECVD process, and the penetration of moisture into the light emitting diode D is prevented by the first inorganic sub-layer 321.

For example, the first inorganic sub-layer 321 may be formed of silicon oxide (SiOx), silicon nitride (SiNx) or siliconoxynitride (SiON). The first inorganic sub-layer 321 may have a thickness of about 0.1 to 2 micrometers, and beneficially, about 1 micrometer. To minimize the moisture penetration into the light emitting diode D, it is preferred that the first inorganic sub-layer 321 may be formed of silicon nitride or siliconoxynitride.

The second inorganic sub-layer 322 is formed on the first inorganic sub-layer 321 and is formed by the ALD process to have excellent step-coverage. For example, the second inorganic sub-layer 322 may be formed of silicon oxide (SiOx), silicon nitride (SiNx) or siliconoxynitride (SiON). The second inorganic sub-layer 322 may have a thickness of about 0.01 to 0.1 micrometers, and beneficially, about 0.05 micrometers.

Since the second inorganic sub-layer 322 is formed by the ALD process, the particles, which are generated on the light emitting diode D and are incompletely covered with the first inorganic sub-layer 321, are completely covered with the second inorganic sub-layer 322.

The first organic layer 323 is formed on the second inorganic sub-layer 322. The first organic layer 323 may be formed using various methods of depositing an organic layer, including but not limited to: vacuum screen printing, inkjet printing, flash evaporation, electro spray coating, and chemical vapor deposition (CVD). The stress applied to the first and second inorganic sub-layers 321 and 322 can be reduced by the first organic layer 323, and the first organic layer 323 provides a flat top surface.

The second inorganic layer 324 is formed on the first organic layer 323. The second inorganic layer 324 is formed by the PECVD process and has a thickness substantially same as the first inorganic sub-layer 321. The penetration of moisture into the light emitting diode D is further prevented by the second inorganic layer 324. The second inorganic layer 324 may be formed of the same material as the first inorganic sub-layer 321.

The second organic layer 325 is formed on the second inorganic layer 324 and prevents damages on the second organic layer 324 by outer impacts. The second organic layer 325 may be formed using various methods of depositing an organic layer, including but not limited to: vacuum screen printing, inkjet printing, flash evaporation, electro spray coating, and chemical vapor deposition (CVD). Namely, in the flexible OLED display device according to the third embodiment of the present invention, an uppermost layer of the encapsulation film 320 is an organic layer.

When the uppermost layer of the encapsulation films 120 and 220 in the first and second embodiments is inorganic layers 123 and 224, the stress by the impacts generated during folding, bending or rolling operation is concentrated in the inorganic layers 123 and 224. Since the inorganic layers 123 and 224 have a relatively high modulus value, i.e., high stiffness, the crack may be generated in the inorganic layers 123 and 224. Namely, the cracks are generated in the encapsulation films 120 and 220 including the inorganic layers 123 and 224 as the uppermost layer such that there are damages on the light emitting diode D by the moisture penetrated through the cracks.

However, by providing the encapsulation film 320, which includes the second organic layer 325 as the uppermost layer, the impacts are absorbed by the second organic layer 325, which has a relatively low modulus value, such that the damages on the encapsulation film 320 is minimized.

A thickness of the first organic layer 323 may be larger than the second organic layer 325. When the thickness of the first organic layer 323, which covers the second inorganic sub-layer 322 formed by the ALD process to completely cover the particles on the light emitting diode D, is relatively small, the top surface of the first organic layer 323 may be non-flat such that the moisture-barrier property of the second inorganic layer 324 may be decreased.

For example, the first organic layer 323 may be formed of acryl-based compounds, and the second organic layer 325 may be formed of epoxy-based compounds. As a result, the flatness of the top surface of the first organic layer 323 is higher than the second organic layer 325, and the modulus value of the second organic layer 325 is smaller than the first organic layer 323. Accordingly, the step difference caused by the particles on the emitting diode is sufficiently compensated by the first organic layer 323 to provide a flat top surface, and the outer impacts are sufficiently absorbed by the second organic layer 325.

On the other hand, the encapsulation films 120 and 220 in the flexible OLED display devices 100 and 200 according to the first and second embodiments of the present invention may include an organic layer as an uppermost layer.

A barrier film 330 further minimizing the moisture penetration and protecting the encapsulation film 320 may be attached onto the encapsulation film 320 using an adhesion layer 340. In this instance, the adhesion layer 340 contacts the second organic layer 325 as the uppermost layer of the encapsulation film 320. For example, the adhesion layer 340 may be a pressure sensitive adhesive. The barrier film 330 and the adhesion layer 340 may be omitted.

The modulus value of the second organic layer 325 is larger than the adhesion layer 340 and smaller than the first organic layer 323 and the second inorganic layer 324. As a result, the outer impact applied onto a display surface of the flexible OLED display device 300 is distributed or dispersed such that the damages on the flexible OLED display device 300 are minimized.

Alternatively, a touch panel (not shown) may be attached the encapsulation film 320 using the adhesion layer 340, and/or a polarization plate (not shown) may be further attached on an outer side of the encapsulation film 320 to reduce ambient light reflection and increase a contrast ratio. In this instance, the polarization plate may be a circular polarization plate.

As mentioned above, in the flexible OLED display device 300 according to the third embodiment of the present invention, the second inorganic sub-layer 322 of the encapsulation film 320 is formed by the ALD process to have excellent step-coverage.

Accordingly, when the first inorganic sub-layer 321 has a relatively small thickness and incompletely covers the particles on the light emitting diode D, the particles are completely covered with the second inorganic sub-layer 322 such that there is no crack in the encapsulation layer 320.

Namely, the flexible OLED display device 300 of the present invention has improved displaying quality and lifetime with minimal thickness increase.

In addition, since the encapsulation film 320 includes the second organic layer 325 as the uppermost layer, the damages on the encapsulation film 320 by the impacts can be minimized.

Figure 7:
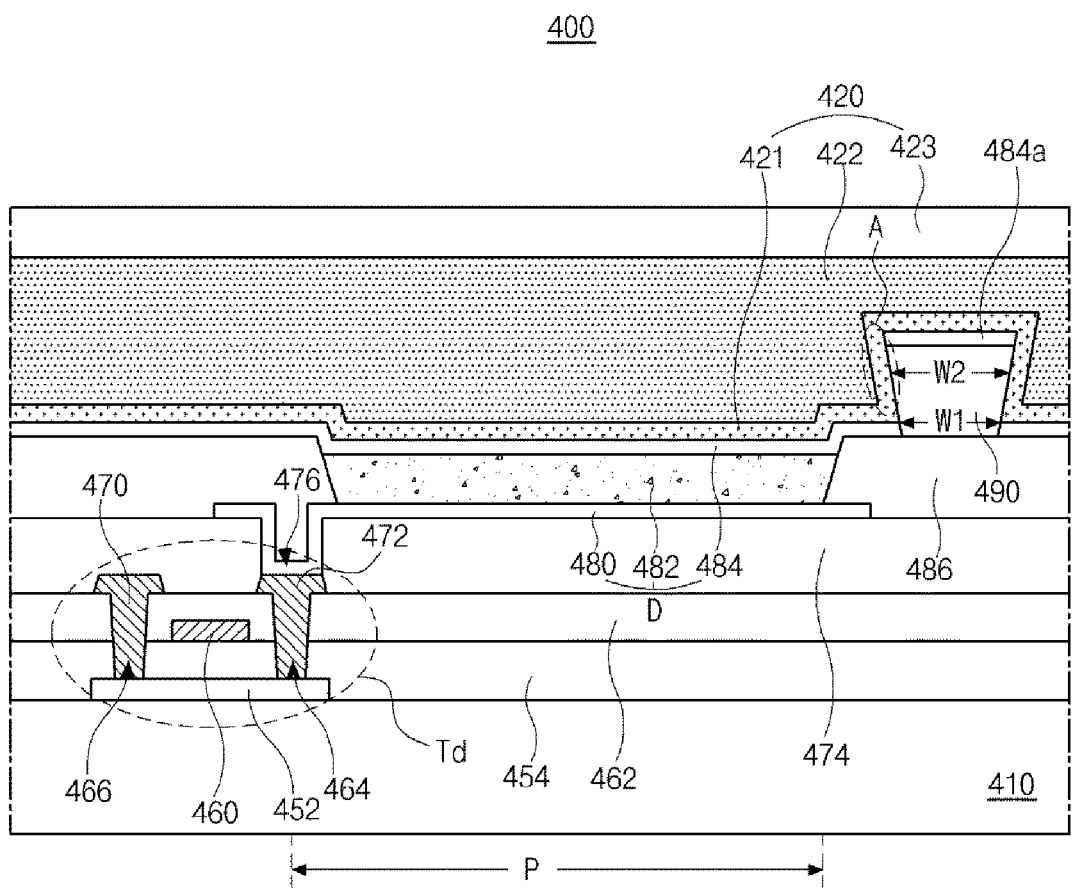
FIG. 7 is a schematic cross-sectional view of a flexible OLED display device according to a fourth embodiment of the present invention.
Figure 8:
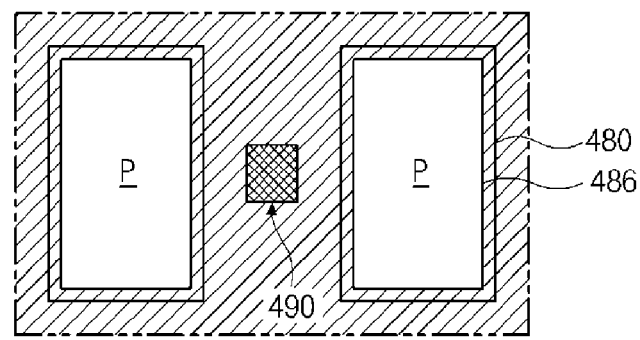
FIG. 8 is a schematic plane view of a flexible OLED display device according to the fourth embodiment of the present invention.

FIG. 7 is a schematic cross-sectional view of a flexible OLED display device according to a fourth embodiment of the present invention, and FIG. 8 is a schematic plane view of a flexible OLED display device according to the fourth embodiment of the present invention. FIG. 8 shows a first electrode, a bank layer and a spacer without other elements.

Referring to FIG. 7, a flexible OLED display device 400 according to the fourth embodiment of the present invention includes a flexible substrate 410, a light emitting diode D on the flexible substrate 410, a spacer 490 at a boundary of the pixel region P and an encapsulation film 420 covering the light emitting diode D and the spacer 490. A first inorganic layer 421 as a lowest layer of the encapsulation film 420 contacts a side surface of the spacer 490.

The flexible substrate 410 may be formed of polymer such as polyimide. However, it is not limited thereto.

Although not shown, a buffer layer, which is formed of an organic insulating material, such as silicon oxide or silicon nitride, may be formed on the flexible substrate 410.

On the flexible substrate 410, a driving TFT Td and a light emitting diode D are formed. In addition, a gate line (not shown) and a data line (not shown), which cross each other to define a pixel region, a power line (not shown), which is parallel to and spaced apart from the gate line or the data line, a switching TFT (not shown), which is connected to the gate and data lines, a storage capacitor (not shown), which is connected to the power line and an electrode of the switching TFT, are further formed on the flexible substrate 410.

The driving TFT Td is connected to the switching TFT and includes a semiconductor layer 452, a gate electrode 460, a source electrode 470 and a drain electrode 472.

The semiconductor layer 452 is disposed on the flexile substrate 410 and may include an oxide semiconductor material or polycrystalline silicon.

When the semiconductor layer 452 includes the oxide semiconductor material, a light-shielding pattern (not shown) may be formed under the semiconductor layer 452. The light to the semiconductor layer 452 is shielded or blocked by the light-shielding pattern such that thermal degradation of the semiconductor layer 452 can be prevented. On the other hand, when the semiconductor layer 452 includes polycrystalline silicon, impurities may be doped into both sides of the semiconductor layer 452.

A gate insulating layer 454 is formed on an entire surface of the flexible substrate 410 including the semiconductor layer 452. The gate insulating layer 454 may be formed of an inorganic insulating material such as silicon oxide or silicon nitride. For example, when the semiconductor layer 452 includes the oxide semiconductor material, the gate insulating layer 454 may be formed of silicon oxide.

A gate electrode 460, which is formed of a conductive material, e.g., metal, is formed on the gate insulating layer 454 to correspond to a center of the semiconductor layer 452. The gate electrode 460 is connected to the switching TFT.

In FIG. 7, the gate insulating layer 454 is formed on the entire surface of the flexible substrate 410. Alternatively, the gate insulating layer 454 may be patterned to have the same shape as the gate electrode 460.

An interlayer insulating layer 462, which is formed of an insulating material, is formed on an entire surface of the flexible substrate 410 including the gate electrode 460. The interlayer insulating layer 462 may be formed of an inorganic insulating material, e.g., silicon oxide or silicon nitride, or an organic insulating material, e.g., benzocyclobutene or photo-acryl.

The interlayer insulating layer 462 includes first and second contact holes 464 and 466 exposing both sides of the semiconductor layer 452. The first and second contact holes 464 and 466 are positioned at both sides of the gate electrode 460 to be spaced apart from the gate electrode 460.

In FIG. 7, the first and second contact holes 464 and 466 extend into the gate insulating layer 454. Alternatively, when the gate insulating layer 454 is patterned to have the same shape as the gate electrode 460, there may be no first and second contact holes 464 and 466 in the gate insulating layer 454.

A source electrode 470 and a drain electrode 472, which are formed of a conductive material, e.g., metal, are formed on the interlayer insulating layer 462. The drain electrode 472 and the source electrode 470 are spaced apart from each other with respect to the gate electrode 460 and respectively contact both sides of the semiconductor layer 452 through the first and second contact holes 464 and 466. The source electrode 470 is connected to the power line (not shown).

The semiconductor layer 452, the gate electrode 460, the source electrode 470 and the drain electrode 472 constitute the driving TFT Td. In FIG. 7, the gate electrode 460, the source electrode 470 and the drain electrode 472 are positioned over the semiconductor layer 452. Namely, the driving TFT Td has a coplanar structure.

Alternatively, in the driving TFT Td, the gate electrode may be positioned under the semiconductor layer, and the source and drain electrodes may be positioned over the semiconductor layer such that the driving TFT Td may have an inverted staggered structure. In this instance, the semiconductor layer may include amorphous silicon.

The switching TFT (not shown) may have substantially the same structure as the driving TFT Td.

A passivation layer 474, which includes a drain contact hole 476 exposing the drain electrode 472 of the driving TFT Td, is formed to cover the driving TFT Td.

A first electrode 480, which is connected to the drain electrode 472 of the driving TFT Td through the drain contact hole 476, is separately formed in each pixel region. The first electrode 480 may be an anode and may be formed a conductive material having a relatively high work function. For example, the first electrode 480 may be formed of a transparent conductive material such as indium-tin-oxide (ITO) or indium-zinc-oxide (IZO).

When the flexible OLED display device 400 is operated in a top-emission type, a reflection electrode or a reflection layer may be formed under the first electrode 480. For example, the reflection electrode or the reflection layer may be formed of aluminum-paladium-copper (APC) alloy.

A bank layer 486, which covers edges of the first electrode 480, is formed on the passivation layer 474. A center of the first electrode 480 in the pixel region is exposed through an opening of the bank layer 486.

The spacer 490 having a reverse-tapered shape is formed on the bank layer 486. Namely, in the spacer 490, a lower portion closer to the bank layer 486 has a width W1 smaller than a width W2 of an upper portion. The side surfaces of the spacer 490 extends between the lower portion to the upper portion. The organic emitting layer 482 is formed by a thermal vapor deposition using a fine metal mask (not shown). In this instance, there may be damages on the light emitting diode D. For example, the fine metal mask contacts the organic emitting layer 482 such that there may be damages on the organic emitting layer 482. Accordingly, to prevent the damage on the organic emitting layer 482, the spacer 490 is formed on the bank layer 486.

The spacer 490 is formed on a portion of the bank layer 486. Namely, referring to FIG. 8, the bank layer 486 has one-body to surround the pixel region P, while the spacers 490 are separately formed on a portion of the bank layer 486. In other words, at least two spacers 490 are spaced apart from each other such that the other portion of the bank layer 486 is exposed.

For example, four spacers 490, which are spaced apart from each other, may be disposed at four sides of each pixel region P. The spacer 490 may be formed of polymer such as polyimide.

An organic emitting layer 482 is formed on the first electrode 480. The organic emitting layer 482 may have a single-layered structure of an emitting material layer formed of an emitting material. Alternatively, to improve emitting efficiency, the organic emitting layer 482 may have a multi-layered structure including a hole injection layer, a hole transporting layer, the emitting material layer, an electron transporting layer and an electron injection layer sequentially stacked on the first electrode 480.

A second electrode 484 is formed over the flexible substrate 410 including the organic emitting layer 482. The second electrode 484 is positioned at an entire surface of the display area AA. The second electrode 484 may be a cathode and may be formed of a conductive material having a relatively low work function. For example, the second electrode 484 may be formed of aluminum (Al), magnesium (Mg) or Al—Mg alloy.

The second electrode 484 exposes a side surface "A" of the spacer 490. Namely, since the spacer 490 has the reverse-tapered shape, the second electrode 484, which is formed by a thermal vapor deposition process or a sputtering process, is discontinuous at the side surface "A" of the spacer 490 such that the side surface "A" of the spacer 490 is exposed or is not covered with the second electrode 484. In other words, a second electrode material pattern 484*a* is formed on an upper surface of the spacer 490 in the process for the second electrode 484, and the second electrode 484 and the second electrode material pattern 484*a* is separated by the spacer 490.

The first electrode 480, the organic emitting layer 482 and the second electrode 484 constitute the light emitting diode D.

Although not shown, a capping layer for improving a light extraction efficiency and formed of an organic material may be formed on the second electrode 484 and the second electrode material pattern 484*a*. The capping layer may have substantially the same shape as the second electrode 484 and the second electrode material pattern 484*a*. As a result, the capping layer completely overlaps the second electrode 484 and the second electrode material pattern 484*a*.

An encapsulation film 420 is formed on the light emitting diode D to prevent penetration of moisture into the light emitting diode D.

The encapsulation film 420 has a triple-layered structure of a first inorganic layer 421, an organic layer 422 and a second inorganic layer 423. However, it is not limited thereto. For example, the encapsulation film 420 may further include an organic layer on the second inorganic layer 423 to have a quadruple-layered structure or may further include an organic layer and an inorganic layer on the second inorganic layer 423 to have a five-layered structure.

The first inorganic layer 421 contacts an entire surface of the second electrode 484 and the second electrode material pattern 484*a* and the side surface "A" of the spacer 490. Alternatively, when the capping layer is formed, the first organic layer 421 contacts an entire surface of the capping layer instead of the second electrode 484 and the second electrode material pattern 484*a*.

The first inorganic layer 421 is formed by the ALD process to have excellent step-coverage. For example, the first inorganic layer 421 may be formed of silicon oxide (SiOx), silicon nitride (SiNx) or siliconoxynitride (SiON). The first inorganic layer 421 may have a thickness of about 0.01 to 0.1 micrometers, and beneficially, about 0.05 micrometers.

An adhesion strength between the first inorganic layer 421 and the spacer 490 is larger than that between the second electrode 484 and each of the organic emitting layer 482, the bank layer 486 and the spacer 490 and that between the first inorganic layer 421 and the second electrode 484. For example, when the spacer 490 is formed of polymer, e.g., polyimide, the adhesion strength between the first inorganic layer 421 and the spacer 490 is increased.

In the related art OLED display device, there is peel-off problem of the second electrode or the organic emitting layer.

For example, since the second electrode 484, which is formed by a thermal vapor deposition process, has a relatively low adhesion strength with the organic emitting layer 482, the bank layer 486 and the spacer 490, the second electrode 484 may be peeled-off. Particularly, the peel-off problem is serious in the flexible OLED display device.

In the flexible OLED display device of the present invention, since the spacer 490 has the reverse-tapered shape, the second electrode 484 exposes the side surface "A" of the spacer 490 and the first inorganic layer 421 contacts and adheres to the side surface "A" of the spacer 490. As a result, the peel-off problem may be prevented.

On the other hand, when the spacer 490 is formed to have a tapered shape, the second electrode 484 contacts the side surface "A" of the spacer 490 as well as the upper surface of the spacer 490 such that the first inorganic layer 421 can not contact the spacer 490. As a result, there is the peel-off problem.

In addition, when the first inorganic layer 421 does not have excellent step-coverage, there is also discontinuation in the first inorganic layer 421 at the side surface "A" of the spacer 490 having the reverse-tapered shape. Namely, since the first inorganic layer 421 can not contact the spacer 490, the peel-off problem is still generated. For example, if the first inorganic layer 421 is formed by the PECVD process, the first inorganic layer 421 can not contact the side surface "A" of the spacer 490.

The organic layer 422 is formed on the first inorganic layer 421. The organic layer 422 may be formed using various methods of depositing an organic layer, including but not limited to: vacuum screen printing, inkjet printing, flash evaporation, electro spray coating, and chemical vapor deposition (CVD). The stress applied to the first inorganic layer 421 can be reduced by the organic layer 422. For example, the organic layer 422 may be formed of an acryl-based material or an epoxy-based material.

The second inorganic layer 423 is formed on the organic layer 422. The second inorganic layer 423 is formed of the PECVD process and has a thickness larger than the first inorganic layer 421. The penetration of moisture into the light emitting diode D is further prevented by the second inorganic layer 423.

For example, the second inorganic layer 423 may be formed of silicon oxide (SiOx), silicon nitride (SiNx) or siliconoxynitride (SiON). The second inorganic layer 423 may have a thickness of about 0.1 to 2 micrometers, and beneficially, about 1 micrometer. To minimize the moisture penetration into the light emitting diode D, it is preferred that the second inorganic layer 423 may be formed of silicon nitride or siliconoxynitride.

As mentioned above, in the flexible OLED display device 400 according to the fourth embodiment of the present invention, the first inorganic layer 421 as a lowest layer of the encapsulation film 420 is formed by the ALD process to have excellent step-coverage.

Accordingly, even if there are particles on the light emitting diode D, the particles are completely covered with the first inorganic layer 421 such that there is no crack in the encapsulation film 420. As a result, the damages on an element in the display area AA, e.g., the light emitting diode D, by moisture penetration are minimized or prevented.

In addition, since the first inorganic layer 421, which is formed by the ALD process, has a relatively small thickness with excellent step-coverage, a thickness of the encapsulation film 420 is not increased.

Namely, the flexible OLED display device of the present invention has improved displaying quality and lifetime without thickness increase.

Moreover, since the first inorganic layer 421 contacts and adheres to the side surface "A" of the spacer 490 having the reverse-tapered shape, the peel-off problem in the light emitting diode D is prevented.

Figure 9:
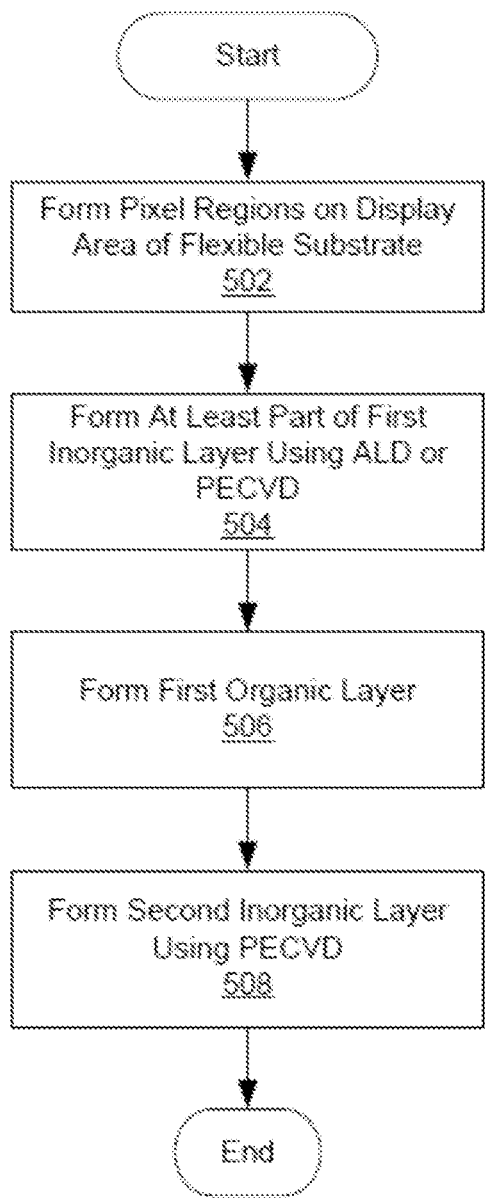
FIG. 9 is a flowchart illustrating a method of forming an organic light emitting diode (OLED) display device, according to one embodiment of the present invention.

FIG. 9 is a flowchart illustrating a method of forming an organic light emitting diode (OLED) display device, according to one embodiment of the present invention.

First, pixel regions are formed 502 on a display area of a flexible substrate. Each pixel region is formed with an organic light emitting diode. At least part of a first inorganic layer is formed 504 on the pixel regions using ALD or PECVD. In one embodiment, the entire first inorganic layer may be formed using ALD.

In another embodiment, a first inorganic sub-layer of the first inorganic layer may be formed using ALD, and a second inorganic sub-layer of the first inorganic layer may be formed on the first inorganic sub-layer using PECVD, after forming the first inorganic sub-layer. In yet another embodiment, a first inorganic sub-layer of the first inorganic layer may be formed using PECVD, and a second inorganic sub-layer of the first inorganic layer may be formed on the first inorganic sub-layer using ALD, after forming the first inorganic sub-layer. Next, a first organic layer is formed 506 on the first inorganic layer, after forming the first inorganic layer. A second inorganic layer is formed 508 on the first organic layer, after forming the first organic layer.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of forming an organic light emitting diode (OLED) display device, comprising:
    forming a plurality of pixel regions on a display area of a flexible substrate, each of the pixel regions including an OLED;
    forming at least part of a first inorganic layer on the plurality of pixel regions using atomic layer deposition (ALD) or plasma-enhanced chemical vapor deposition (PECVD);
    forming a first organic layer over the entire first inorganic layer;
    forming a second inorganic layer using PECVD on the first organic layer;
    forming a second organic layer on the second inorganic layer; and
    attaching a barrier film on the second organic layer using an adhesion layer between the second organic layer and the barrier film,
    wherein a modulus value of the second organic layer is larger than a modulus value of the adhesion layer and smaller than a modulus value the first organic layer and a modulus value of the second inorganic layer.

2. The method of claim 1, wherein the entire first inorganic layer is formed using ALD.

3. The method of claim 1, wherein forming at least part of the first inorganic layer comprises:
    forming a first inorganic sub-layer of the first inorganic layer using ALD; and
    forming a second inorganic sub-layer of the first inorganic layer using PECVD.

4. The method of claim 3, wherein the second inorganic sub-layer is formed on the first inorganic sub-layer.

5. The method of claim 3, wherein the first inorganic sub-layer is formed on the second inorganic sub-layer.

6. The method of claim 3, wherein a thickness of the first inorganic sub-layer is 0.01 to 0.1 micrometers.

7. The method of claim 3, wherein a thickness of the second inorganic sub-layer and the second inorganic layer is 0.1 to 2 micrometers.

8. The method of claim 1, wherein a thickness of the first organic layer is larger than a thickness of the second organic layer, the first organic layer formed of acryl-based compounds and the second organic layer formed of epoxy-based compounds.

9. The method of claim 1, wherein the second organic layer is over the entire second inorganic layer.

* * * * *